COMPOSITE METAL LAMINATE MATERIAL AND LEAD FRAME

Filed Nov. 4, 1970 2 Sheets-Sheet 1

INVENTOR.
Marvin B. Happ
James G. Harper
BY
Gerald B. Epstein Att'y.

Aug. 15, 1972 M. B. HAPP ET AL 3,684,464

COMPOSITE METAL LAMINATE MATERIAL AND LEAD FRAME

Filed Nov. 4, 1970 2 Sheets-Sheet 2

INVENTOR.
Marvin B. Happ
BY James G. Harper

Gerald B. Epstein Att'y.

United States Patent Office 3,684,464
Patented Aug. 15, 1972

3,684,464

COMPOSITE METAL LAMINATE MATERIAL AND LEAD FRAME

Marvin B. Happ, Hingham, Mass., and James G. Harper, Dallas, Tex., assignors to Texas Instruments Incorporated, Dallas, Tex.

Filed Nov. 4, 1970, Ser. No. 86,658
Int. Cl. H01b *5/14*
U.S. Cl. 29—191.6 4 Claims

ABSTRACT OF THE DISCLOSURE

A composite metal laminate material is disclosed as well as a lead frame fabricated therefrom which is particularly adapted for use in the manufacture of plastic encapsulated integrated circuit devices. The composite metal laminate includes a core of metallic material disposed intermediate and metallurgically bonded to outer metallic layers of a different material from the core and further includes a stripe having an exposed surface of a material selected from the group consisting of silver, gold, or aluminum, metallurgically bonded to one of the outer metallic layers and extending longitudinally of the outer metallic layer in order to provide a bonding surface. The composite metal laminate material is adapted to be formed into a lead frame configuration to permit the mounting of an integrated circuit device on a portion of the stripe, while electrical connections may be made between the device and various regions of the lead frame bonding surface defined by the stripe.

Traditionally, various metallic materials, such as the material referred to by the designation alloy F–15 (29% nickel, 17% cobalt, 54% iron) often referred to by the trade name Kovar, have achieved wide acceptance as lead frame materials in forming highly reliable, hermetic glass-sealed metal packages. Other alloys, having similar characteristics, have been utilized in forming lead frames suitable for use in packaging various types of plastic integrated circuit devices. However, problems have occurred in utilizing these materials in certain instances due to inadequate corrosion resistance properties, inadequate thermal dissipation properties, thermal mismatch with plastic encapsulation materials, etc. In addition, material cost has become increasingly significant since the price of integrated circuit devices has decreased, while the cost of the materials utilized in forming the lead frame for packaging the device have continually increased. Various substitute metallic materials have been suggested but still present certain difficulties in view of problems in stamping the lead frame, problems in forming electrical connections thereto, etc. Accordingly, the need has arisen for the provision of a composite metal laminate material in which cost is minimized by minimizing the quantities of expensive metals utilized, while matching the requirements of the overall system such as mechanical strength, corrosion-resistance, thermal characteristics, to the characteristics of the semiconductor device as well as to the characteristics of the encapsulation material so as to provide a completed package having desired characteristics.

It is an object of the present invention to provide a novel and improved composite metal laminate material particularly adapted for use in the formation of lead frames;

It is another object of the present invention to provide an improved composite metal laminate material which is particularly adapted for use in the formation of lead frames for use in fabricating plastic encapsulated integrated circuit devices; and It is a further object of the present invention to provide an improved composite metal laminate material particularly adapted for use in forming lead frames for use in fabricating plastic encapsulated integrated circuit devices, which material is relatively inexpensive, matches the characteristics of various other materials utilized in the formation of the completed device, and is extremely durable in use.

Other objects and advantages of the present invention will be readily apparent from the following detailed description and accompanying drawings wherein.

Figure 1:
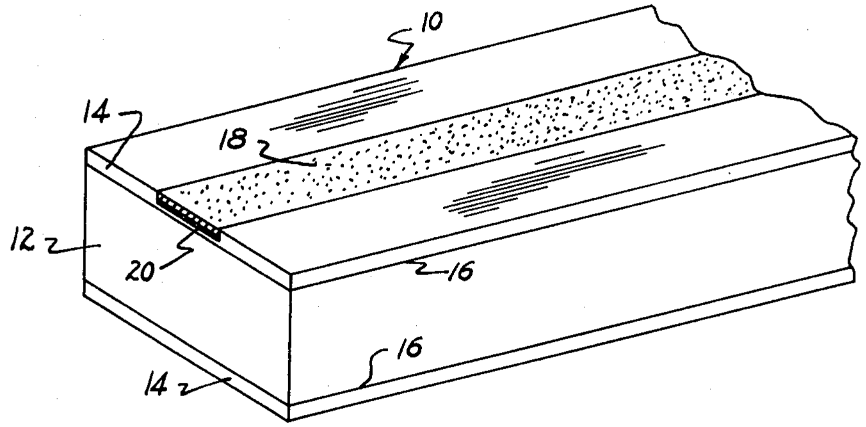
FIG. 1 is a perspective view of a longitudinally extending strip of the composite metal laminate material of the present invention.

Referring to the drawings and initially to FIG. 1, a novel and improved composite material in accordance with the present invention is indicated generally by the reference numeral 10. As shown, this material includes a central core 12 of metallic material which is disposed intermediate and metallurgically bonded between outer metallic layers 14 of a different material from the core 12, the outer metallic layers being metallurgically bonded to the core substantially throughout the entire length of the interfaces 16 therebetween. In addition, a stripe 18 having an exposed surface of a material selected from the group consisting of silver, gold, and aluminum is provided. The stripe 18 is metallurgically bonded onto one of the outer metallic layers 14 substantially throughout the entire length of its interface therewith. The stripe 18 is preferably arranged to extend generally along the longitudinal axis of the composite metal laminate structure in order to facilitate subsequent procedures during the fabrication of the composite metal laminate into a desired end product. The stripe 18 is disposed generally at the outer surface of one of the outer metallic layers 14, and may be arranged such that its outer exposed surface protrudes above the surface of the layer 14, if desired, but in a preferred embodiment and, as illustrated, the stripe 18 is arranged in an inlaid configuration such that its outer exposed surface is generally flush with the outer surface of the outer metallic layer 14. In accordance with the present invention, the metallic layers 12 and 14, as well as the stripe 18, are preferably solid-phase metallurgically bonded together in a manner free of any intermetallic compounds at the respective interfaces therebetween in the manner shown in U.S. Pat. No. 2,691,815 or in U.S. Pat. No. 2,753,623, although the various layers may be also metallurgically bonded together in other conventional manners within the scope of the present invention. In a preferred embodiment of the present invention, the total thickness of the composite metal laminate material 10 is approximately 0.010 inch with each of the outer metallic layers 14 preferably comprising between 5 to 10% of the total composite thickness. However, in various other practical embodiments of the present invention, the metallic layers 14 may each comprise as much as 20% of the total composite thickness.

In accordance with the principles of the present invention, the core layer 12 of the composite metal laminate material 10 preferably is fabricated of a preselected metallic material, such as various types of ferritic stainless steel materials or copper, although various low carbon steel materials or austenetic stainless steel materials may be utilized in certain instances, while the metallic outer layers are fabricated of various materials which are compatible with the material of the core and are thermally compatible with various types of plastic encapsulation materials. In order to provide the requisite thermal compatibility with plastic encapsulation material as well as with semiconductor devices to be mounted to the composite, as will be subsequently explained, it is generally desirable that the core material, which defines the major volume of the composite 10, have a coefficient of thermal expansion which is approximately equal to or less than $7.4 \times 10^{-6}$ inch per inch per degree Fahrenheit. In addition, it is desirable that the core material have good corrosion resistance properties in order to increase the durability of the resultant structure which is formed of the composite. Similarly, the outer layers 14 may be fabricated of various materials which are chemically and thermally compatible with plastic encapsulation material, have good bonding properties, and also have good heat dissipation properties in order to permit the use of higher powered semiconductor devices. Thus, the composite metal laminate 10 is provided with the requisite controlled expansion characteristics for compatibility with plastic encapsulation material and various semiconductor devices.

For example, in several embodiments of the present invention, the metallic core 12 may comprise ferritic stainless steel material such as AISI (American Iron & Steel Institute) type 409 stainless steel which comprises by weight, 0.15% (max.) carbon, 1.00% (max.) manganese, 1.00% (max.) silicon, 0.030% (max.) sulphur, 11.50% to 13.50% chromium, and the remainder iron; AISI type 430 stainless steel comprising by weight, 0.12% (max.) carbon, 1.00% (max.) manganese, 1.00% (max.) silicon, 0.030% (max.) sulphur, 14.00 to 18.00% chromium, and the remainder iron. The outer layers 14 may be formed of various materials which generally satisfy the criteria set forth hereinabove. Several examples of materials suitable for use as the outer metallic layers 14 in conjunction with a ferritic stainless steel core material include substantially pure nickel, substantially pure copper, and alloy F–15 typically sold under the trade name Kovar, which comprises approximately 29% nickel, 17% cobalt, and 54% iron. If desired, various other materials also may be utilized for the outer metallic layers as long as the resultant composite metal laminate material has the requisite controlled expansion characteristics for compatibility with the plastic encapsulation material to be used and the semiconductor device which is to be mounted on the subsequently fabricated lead frame. In addition, in other embodiments of the present invention, the metallic core 12 may comprise substantially pure copper, while the outer metallic layers 14 comprise a material such as alloy F–15 sold under the trade name Kovar, the composition of which has been specified hereinabove.

The metal stripe 18 provided at the surface of one of the outer metal layers 14, as previously mentioned, is preferably inlaid within the surface such that its outer exposed surface is substantially flush with the outer surface of the outer metallic layer 14. The stripe 18 is preferably centrally disposed along the longitudinal axis of the composite metal laminate material 10 and generally defines the regions of the composite laminate to which the semiconductor device is to be bonded, as well as the regions to which conductors extending from preselected areas of the semiconductor device are to be bonded in order to facilitate the formation of the requisite electrical connections between the semiconductor device and the lead frame into which the composite laminate is to be formed. Accordingly, the stripe 18 is formed of a preselected material or composite such that its exposed outer surface has extremely good bonding characteristics, as well as having characteristics compatible with the material of the semiconductor device to be bonded thereto. Accordingly, at least the exposed outer surface of the stripe 18 is fabricated of a material selected from the group consisting of silver, gold, and aluminum. Gold or silver are particularly adapted for use in this regard since gold conductor wires are frequently utilized for making the above-described electrical connections between the semiconductor device and the lead frame, while aluminum, although not generally compatible with gold conductor wires in accordance with presently available technology, may be suitable for use when materials other than gold are utilized for the conductor wires. In addition, it may be seen that by virtue of providing relatively expensive material at only a limited area of the composite laminate, as defined by the stripe 18, the use of relatively expensive metals in the composite metal laminate is substantially reduced so as to reduce the cost of the structure, while still providing the desired bonding characteristics. In addition, in certain instances, it may be desirable to form the stripe 18 in a multi-layered configuration as in FIG. 1, in which its exposed surface comprises silver, gold, or aluminum while an intermediate layer 20 of a preselected material, such as nickel or an iron-nickel alloy, is metallurgically bonded intermediate the outer exposed surface of silver, gold, or aluminum and the outer metallic layer 14, as shown. If desired, the intermediate layer may be arranged such that its edges extend to the outer surface of the outer metallic layer 14 so as to partially envelop the stripe 18, thereby providing isolation between the outer metallic layer 14 and the exposed surface of the stripe. The provision of the intermediate nickel or iron-nickel alloy layer may be advantageous in certain instances, such as, for example, when the core or one of the outer metallic layers comprises copper in that the nickel provides a diffusion barrier to prevent copper from poisoning the semiconductor device, while the outer exposed surface of the stripe 18 remains of a material such as silver, gold or aluminum to facilitate bonding the semiconductor device and associated electrical connections to the composite laminate material.

Figure 2:
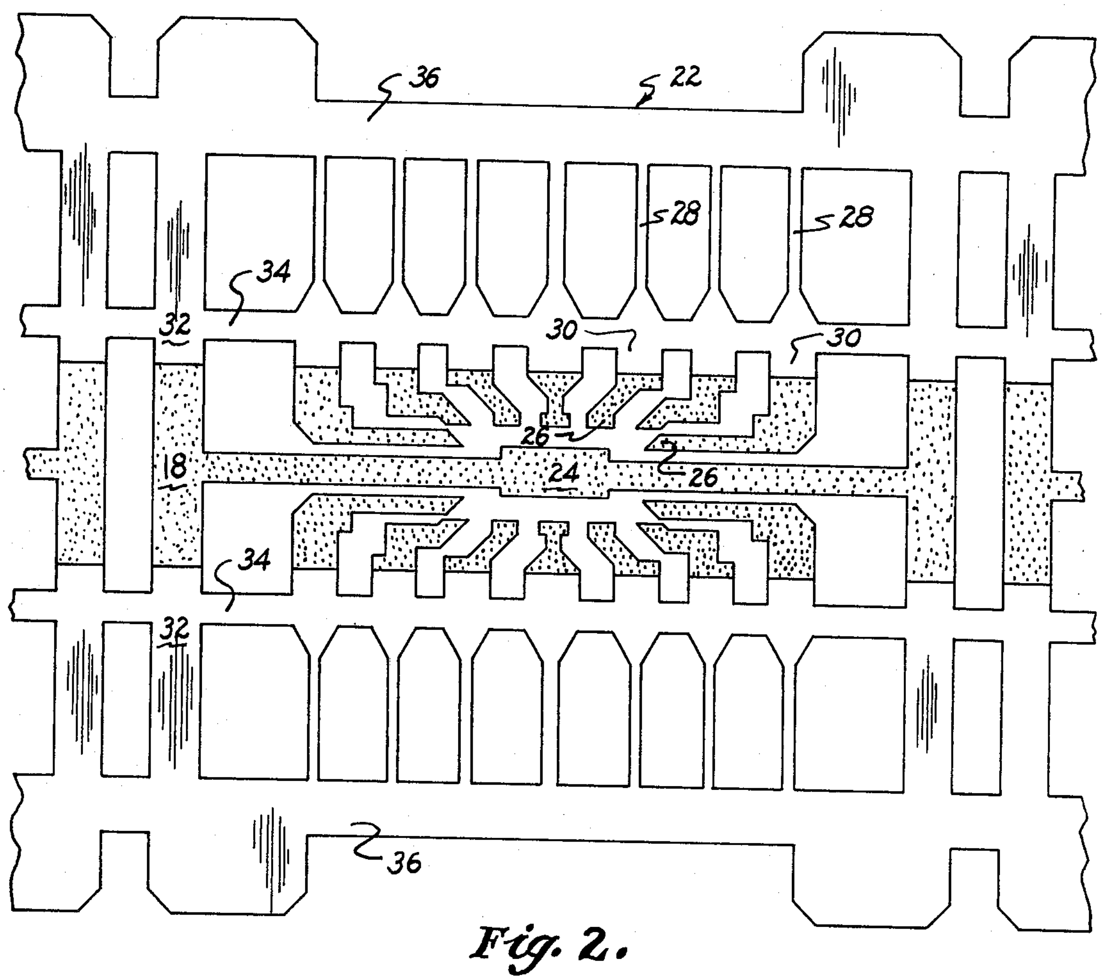
FIG. 2 is a partial plan view of a lead frame which is fabricated from the composite metal laminate of FIG. 1 and an intermediate state in the formation of the lead frame.

In accordance with the principles of the present invention, the composite metal laminate material 10 is adapted to be formed into a conventional lead frame configuration, utilizing conventional techniques, as illustrated in FIG. 2, wherein the reference numeral 22 generally indicates the lead frame structure which is formed. More particularly, as illustrated in FIG. 2, a portion of the strip of composite laminate material 10 of FIG. 1 is blanked-out in a conventional manner in order to form the lead frame configuration 22 with the portion defined by the generally centrally located stripe 18 being advantageously utilized, as will be presently explained. In this connection, the lead frame 22 is formed to include a generally centrally located bonding pad 24, which is adapted to support a semiconductor device to be bonded thereto, a plurality of lead members 26, which are arranged in adjacent spaced relationship about the bonding pad, a plurality of terminal members 28 extending outwardly from the respective lead members 26, and a plurality of shoulder members 30 each of which respectively integrally connects one of the lead members 26 with an associated terminal member 28, as shown. In addition, at the stage of fabrication of the lead frame 22 illustrated in FIG. 2, suitable frame supporting means 32 are provided defined by a skeletal structure, including arms 34 and 36, respectively, extending longitudinally along the lead frame structure between the respective shoulder portions 30 and along the outer peripheral longitudinal edges of the lead frame, in order to support the lead members 26 and terminal members 28 during this stage of fabrication. In addition, such an arrangement permits a plurality of lead frame configurations to be repetitively blanked in sequence along a strip of the composite laminate material 10 so as to facilitate the production of a large quantity of lead frames temporarily held together by the support means 32. The arms 34, 36 are adapted to be removed at a subsequent stage of manufacture so as to effect electrical separation between each respective lead member and its associated terminal member and the next adjacent lead member and its associated terminal member.

As will be seen from FIG. 2, in accordance with an important feature of the present invention, the area defined by the stripe 18 includes that portion of the lead frame from which the lead members 26 and the bonding pad 24 are formed, while the remainder of the surface of the lead frame is defined by the outer metallic layer 14. Thus, the advantageous bonding properties of the stripe 18 are obtained in those regions where such properties are desired, while minimizing the quantity of metal necessary to achieve these properties. Similarly, the provision of the stripe 18 at these regions on the surface of the lead frame eliminates the necessity for the application of various plating coatings which might otherwise be required in order to improve bonding characteristics.

Figure 3:
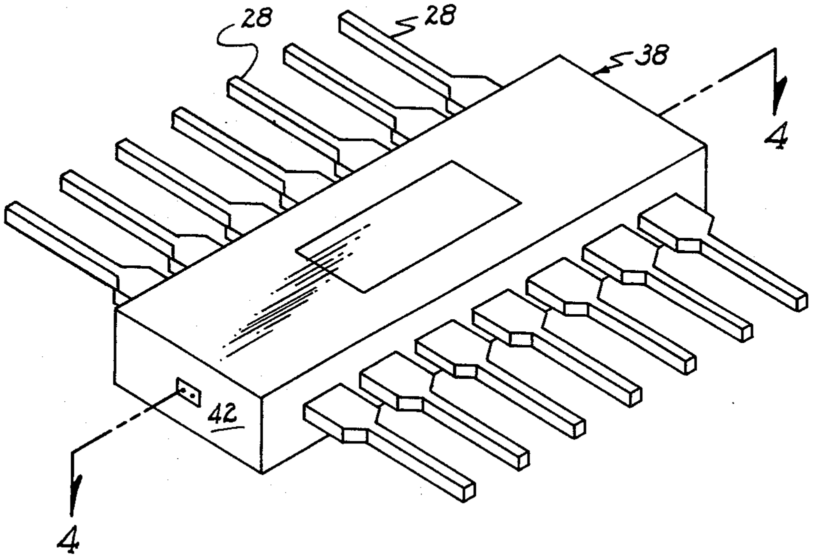
FIG. 3 is a perspective view of an integrated circuit device incorporating a lead frame formed of the composite metal laminate material of the present invention.
Figure 4:
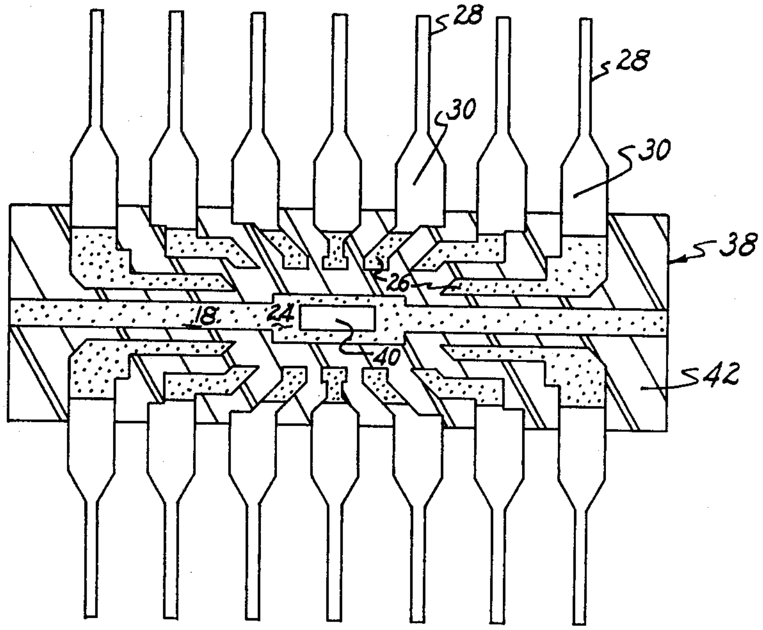
FIG. 4 is an enlarged sectional view taken along line 4—4 of FIG. 3.

The lead frame structure 22 described hereinabove may be conveniently utilized in a conventional manner in the formation of a plastic encapsulated semiconductor device such as an integrated circuit device, as shown in FIGS. 3 and 4, and indicated generally by the reference numeral 38. In this connection, a suitable semiconductor device 40 such as an integrated circuit device having a plurality of circuit elements at a surface thereof is attached to the stripe material 18 at the surface of the bonding pad 24, as shown, the semiconductor device being bonded to the surface of the bonding pad under pressure and temperature in the conventional manner. Various of the circuit elements (not shown) of the semiconductor device 40 may then be electrically connected to the plurality of lead members 26 and hence to the associated lead terminals 28 by means of conductor wires (not shown) in the conventional manner, utilizing thermocompression techniques, or the like. It may be seen that the stripe material 18 coats the surfaces of the lead member 26 so that the conductor wires may be bonded to the exposed surface of the stripe material, thereby facilitating the formation of electrical connections between the semiconductor device and the lead members 26, while the semiconductor device 40 is similarly attached to the exposed surface of the stripe material 18 on the semiconductor bonding pad 24 to facilitate attachment. As shown in FIGS. 3 and 4, the semiconductor device 40, the lead members 26, and the shoulder portions 30 are then encapsulated in a suitable conventional plastic encapsulation material 42 such as a thermosetting epoxy, while the terminal members 28 extend from opposite sides of the encapsulation material to permit connections to external circuitry. In addition, the support means 32 is removed in a conventional blanking operation or the like prior to or as a part of the encapsulation procedure so as to provide separation between each terminal member and its associated lead member and the next adjacent terminal member and its associated lead member, while the encapsulation material 42 maintains the various elements of the lead frame in the desired orientation in the completed device.

In the arrangement illustrated and formed in accordance with the principles set forth hereinabove, it is found that the lead frame 22 may be formed having an effective coefficient of thermal expansion which is less than or equal to approximately $7.4\times10^{-6}$ inch per inch per degree Fahrenheit, which is compatible with the thermal expansion requirements of most plastic materials presently utilized for encapsulating semiconductor integrated circuit devices. In addition, it has been found that the composite metal laminate material embodied in the lead frame has sufficient thermal conductivity and heat dissipation properties to permit the use of relatively high power semiconductor devices, as well as to permit the use of thermocompression bonding techniques in securing the semiconductor circuit device 40 to the bonding pad 24, as well as in making electrical connections between the device 40 and the various lead members 26 without causing undue heating of the device 40. Furthermore, it has been found that the lead frame material displays extremely good corrosion-resistant properties and may be readily blanked in the desired lead frame configuration while providing good structural integrity and fatigue strength to prevent inadvertent breakage of the lead frame during fabrication and use. Moreover, it is found that substantial cost savings result by minimizing the use of relatively expensive metals by restricting the provision of such metals to the region defined by the stripe where bonds are to be effected.

Thus, it has been shown that a composite metal laminate may be formed into a lead frame, the laminate including a metallic core of a material having preselected properties, with outer metallic layers having other desired properties being metallurgically bonded to the core in order to achieve desired characteristics in the completed device while a stripe of a suitable metal is provided extending generally centrally along the surface of one of the outer metallic layers to provide an exposed surface having excellent bonding characteristics in order to facilitate attachment of a semiconductor device thereto as well as to facilitate the bonding of conductor wires between the semiconductor device and other regions of the surface of the lead frame defined by the stripe.

Various changes and modifications in the above-described embodiment will be readily apparent to those skilled in the art and any of such changes or modifications are deemed to be within the spirit and scope of the present invention as set forth in the appended claims.

We claim:

1. A composite metal laminate strip material useful in making lead frames for integrated circuit devices, said laminate material comprising a core layer strip of metallic material disposed between and metallurgically bonded to two outer layer strips of another metallic material, said composite material having a total composite thickness of approximately 0.010 inch, said outer strip materials each having a thickness comprising from about 5 to about 20 percent of said total composite thickness, one of said outer strip materials having a stripe of a third metallic material inlaid therein extending longitudinally along said outer strip material, said stripe being flush with and exposed at the surface of said one outer strip material and being separated from said core material by a portion of said one outer strip material.

2. A composite metal laminate material as set forth in claim 1 wherein said core material is selected from the group consisting of ferritic stainless steels and copper, wherein said outer strip material is selected from the group consisting of nickel, of an alloy having a composition, by weight, of approximately 29 percent nickel, 17 percent cobalt, and 54 percent iron, and, where said core material is ferritic stainless steel, of copper, and wherein said stripe material is selected from the group consisting of silver, gold and aluminum.

3. A lead frame comprising a centrally arranged bonding pad, a plurality of lead members disposed in adjacent spaced relationship about said bonding pad, a plurality of terminal members extending outwardly from said respective lead members, a plurality of shoulder members connecting said respective lead members with said respective terminal members, and support means for supporting said pad and said lead, terminal and shoulder members, said lead frame embodying a composite metal laminate material comprising a core layer of metallic material disposed between and metallurgically bonded to two outer layers of another metallic material, said composite material having a total composite thickness of approximately 0.010 inch, said outer layer materials each having a thickness comprising from about 5 to about 20 percent of said total composite thickness, one of said outer layer materials having a stripe of a third metallic material inlaid therein which is disposed flush with and exposed at the surface of said one outer layer material and which is separated from said core material by a portion of said one outer layer material, and stripe extending over said bonding pad and a portion of each of said lead members adjacent to said bonding pad.

4. A lead frame as set forth in claim 3 wherein said composite material has a core material selected from the group consisting of ferritic stainless steels and copper, wherein said composite material has outer layer materials selected from the group consisting of nickel, of an alloy having a composition, by weight, of approximately 29 percent nickel, 17 percent cobalt, and 54 percent iron, and, where said core material is ferritic stainless steel, of copper, and wherein said composite material has a stripe material selected from the group consisting of silver, gold and aluminum.

References Cited

UNITED STATES PATENTS

| | | | |
|---|---|---|---|
| 3,469,953 | 9/1969 | St. Clair et al. | 29—193.5 |
| 3,484,533 | 12/1969 | Kauffman | 29—193.5 X |
| 2,249,417 | 7/1941 | Chace | 148—127 X |
| 2,718,690 | 9/1955 | Ulam | 29—196.3 X |
| 3,555,169 | 1/1971 | Miller | 29—196.3 X |

ALLEN B. CURTIS, Primary Examiner

U.S. Cl. X.R.

29—193.5